United States Patent [19]

Otani

[11] Patent Number: 5,300,484

[45] Date of Patent: Apr. 5, 1994

[54] MBE OR MO-MBE PROCESS FOR FORMING BI-SR-CA-CU-O SUPERCONDUCTING THIN FILMS

[75] Inventor: Seigen Otani, Kawasaki, Japan

[73] Assignee: Fujitsu Limited, Kawasaki, Japan

[21] Appl. No.: 851,200

[22] Filed: Mar. 13, 1992

[30] Foreign Application Priority Data

Mar. 15, 1991 [JP] Japan .................................. 3-051049

[51] Int. Cl.$^5$ ........................ B05D 5/12; C30B 23/00; H01L 39/24

[52] U.S. Cl. .................................. 505/473; 505/730; 505/742; 427/62; 427/126.3; 156/603; 156/610

[58] Field of Search .......................... 505/1, 730, 742; 427/62, 63, 126.3; 156/603, 610

[56] References Cited

FOREIGN PATENT DOCUMENTS 0292958 11/1988 European Pat. Off. .
0305292 3/1989 European Pat. Off. .

OTHER PUBLICATIONS

Journal of Crystal Growth, vol. 102, No. 3, May 1990, Amsterdam NL, pp. 361–375; Schlom: "Molecular Beam Epitaxial Growth of Layered BI-Sr-Ca-Cu—O Compounds".

Japanese Journal of Applied Physics, vol. 29, No. 11, Nov. 1990, Tokyo, Japan pp. 2045–2048; Ishizuka: "Phase Control of BI-Sr-Ca-Cu-O Thin Films Prepared by Coevaporation With RF Oxygen Plasma".

Tomoji Kawai: "Design an Synthesis of High Tc Superconducting Superlattice by Successive Deposition Method", Bulletin of the Japan Institute of Metals, vol. 29, No. 9, (1990), pp. 733–739.

J. N. Eckstein et al., "Epitaxial growth of high-temperature superconducting thin films", J. Vac. Sci. Technol. B7 (2), 1989, pp. 319–323.

Furukawa et al, "Preparation of Bi-Sr-Ca-Cu-O Films by MBE Using an Oxygen Radical Beam Source", Advanced in Superconductivity III, Nov. 1990 pp. 1069–1072.

Tsukamoto et al, "Low-Temperature Annealing Effect on Bi-Sr-Ca-Cu-O Thin Films Prepared by Layer-By-Layer Deposition", (Jpn. J. Appl. Phys. 3015A) May 1991 pp. 830–833.

Tsukada et al, "In-Situ Growth of Bi-Sr-Ca-Cu-O Films by Shutter-Controlled Molecular Beam Epitaxy", Supercond. Sci. Technol. 4 (1991) pp. 118–120.

Primary Examiner—Roy King
Attorney, Agent, or Firm—Staas & Halsey

[57] ABSTRACT

A method of forming a Bi-Sr-Ca-Cu-O system ($Bi_2Sr_2CaCu_2O_x$) superconducting thin film in which two half-unit cells constitute a Perovskite structure layer, characterized in that Sr and Bi layers, which are present between said half-unit cells, are each deposited without oxidation by using an MBE process or an MO-MBE process with an atomic layer level control capability. A critical current density of the Bi-Sr-Ca-Cu-O system superconducting thin film is not significantly reduced.

2 Claims, 3 Drawing Sheets

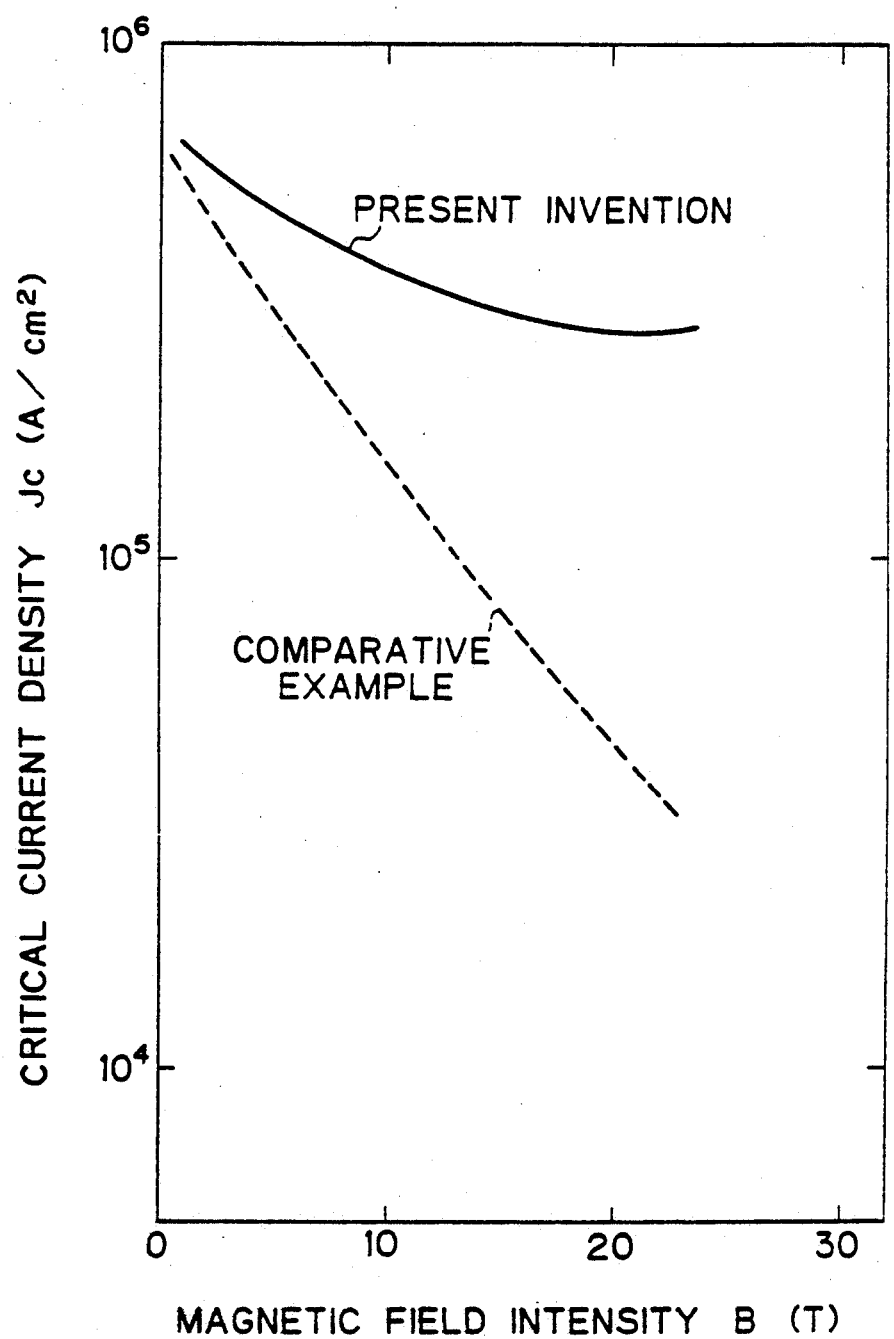

MBE OR MO-MBE PROCESS FOR FORMING BI-SR-CA-CU-O SUPERCONDUCTING THIN FILMS

BACKGROUND OF THE INVENTION

1. Field of the Invention

The present invention relates to an oxide high-temperature superconductor, and more particularly, to a Bi-Sr-Ca-Cu-O system superconducting thin film and a method of forming the same.

2. Description of the Related Art

Attempts have been made to adapt their superconductors to devices or wirings thereby using superconduction properties (e.g., zero electric-conductivity). However, since a critical temperature (Tc) of the superconductors is very low, they can be used only in liquid helium (He). Recently developed oxide superconductors have a relatively high Tc, so that they can be used in liquid nitrogen (N). Furthermore, an oxide high-temperature superconducting film can be formed by depositing the oxide on a substrate under an atomic layer control, and such a film formation has been attempted and studied (cf., Tomoji KAWAI: "Design and Synthesis of High Tc Superconducting Superlattice by Successive Deposition Method", Bulletin of the Japan Institute of Metals, Vol. 29, NO. 9 (1990), pp. 733-739, and J. N. Eckstein et al., "Epitaxial growth of high-temperature superconducting thin films", J. Vac. Sci. Technol. B7 (2), 1989, pp. 319-323).

In contrast to metal superconductors, the oxide high-temperature superconductors have a problem, in that its coherent length ($\xi c$) in the C-axis direction is remarkably short. For example, it is presumed that the respective coherent lengths of a Y-Ba-C-O system oxide and a Bi-Sr-Ca-Cu-O system oxide are about 0.3 nm and 0.1-0.2 nm, and thus these coherent lengths are very small compared with coherent lengths of the metal superconductors (e.g., 100 nm of Pb and 40 nm of Nb). Therefore, when a magnetic field is applied to the oxide superconductor in the C-axis direction, the critical temperature Tc is remarkable lowered.

In Bi system oxide superconducting films (e.g., $Bi_2Sr_2Ca_{n-1}Cu_nO_x$), the partitioning Perovskite structure layer of the BiO layer serves as an electron-shielding (blocking) layer, and electrons of $CuO_2$ layers which clearly afford the superconductivity function can scarcely pass through the BiO layer, thereby shortening the coherent length ($\xi c$) of the Bi-Sr-Ca-Cu-O system oxide. If the number (m) of $CuO_2$ layers in a half-unit cell of the Perovskite structure layer is increased, the coherent length can elongate. However, when the number (m) of the $CuO_2$ layers is 4 or more, the critical temperature falls, and at m=5 it becomes 10° K. or less (namely, such an oxide superconducting film necessitates helium cooling).

SUMMARY OF THE INVENTION

An object of the present invention is to provide a Bi-Sr-Ca-Cu-O system oxide superconducting thin film of which a critical current does not lower under an increasing magnetic field without decreasing the critical temperature.

Another object of the present invention is to provide a method of forming the above-mentioned Bi-Sr-Ca-Cu-O system oxide superconducting thin film.

The above-mentioned and other objects of the present invention are attained by providing a Bi-Sr-Ca-Cu-O system (e.g., $Bi_2Sr_2CaCu_2O_x$ (2-2-1-2)) superconducting thin film in which two half-unit cells constitute a Perovskite structure layer, characterized in that a substantially metallic Sr atomic layer and two substantially metallic Bi atomic layers lie between respective CuO atomic layers of said half-unit cells.

According to the present invention, a method of forming the above-mentioned Bi-Sr-Ca-Cu-O system superconducting thin film is characterized in that Sr and Bi, which are present between the half-unit cells, are each deposited without oxidation by using a molecular-beam epitaxy (MBE) process or MO-MBE process with an atomic layer level, or thickness, control capability.

When the Bi-Sr-Ca-Cu-O system superconducting thin film is formed on a substrate under atomic layer control conditions, Sr and Bi, which are present between the half-unit cells, are each deposited as they are and thus without oxidation, so that Bi is not substantially oxidized (i.e., Bi is slightly oxidized to form $BiO_{1-x}$, wherein x is 0.1 to 0.3). Such a substantially metallic Bi atomic layer (the $BiO_{1-x}$) has a smaller electron-shielding ability. Therefore, electrons of the $CuO_2$ layers can easily flow through the Bi ($BiO_{1-x}$) layer, which will definitely makes the coherent length of the oxide superconducting thin film longer. As a result, a critical electric current density of the obtained thin film does not substantially deteriorate (decrease) within a magnetic field.

Preferably, a single Sr atomic layer and two Bi atomic layers are formed between CuO atomic layers of the half-unit cells.

BRIEF DESCRIPTION OF THE DRAWINGS

The present invention will be more apparent from the description of the preferred embodiments set forth below, with reference to the accompanying drawings, in which:

FIG. 3 is a graph showing a relationship between a critical current density of Bi-Sr-Ca-Cu-O system superconducting thin films and a magnetic field intensity.

DESCRIPTION OF THE PREFERRED EMBODIMENTS

Figure 1:
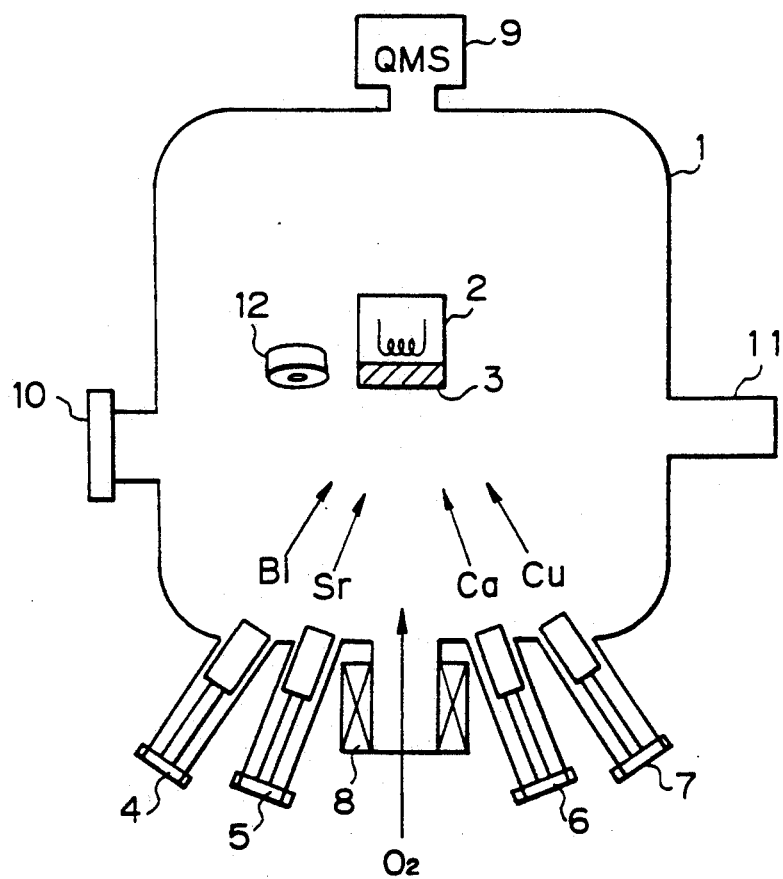
FIG. 1 is a schematic view of a conventional MBE apparatus.

Referring to FIG. 1, a conventional MBE apparatus comprises a vacuum (growth) chamber 1, a substrate holder 2 with a heater, Knudsen cells 4 to 7 for Bi, Sr, Ca and Cu, respectively, and an electron cyclotron resonance (ECR) device 8 for generating an oxygen plasma. The MBE apparatus is provided with a quadru mass spectrometer (QMS) 9, a reflection high-energy electron diffraction (RHEED) screen 10, an electron gun 11 for the RHEED screen 10 and a thickness monitor 12 comprising a quartz oscillator. A substrate (of MgO or $SrTiO_3$) 3 is set on the holder 2.

A Bi-Sr-Ca-Cu-O system superconducting thin film is formed (deposited) on the substrate 3 as follows.

Figure 2:
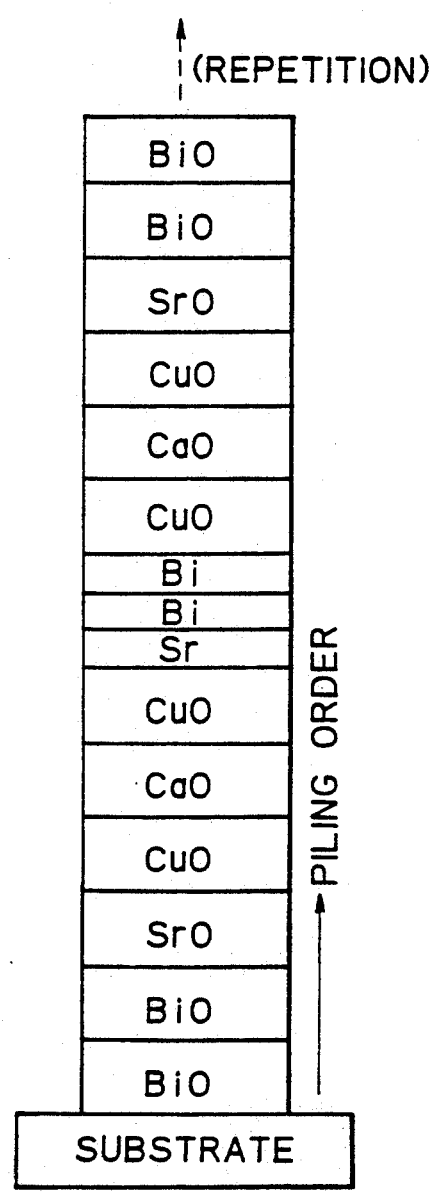
FIG. 2 is a schematic sectional view of a Bi-Sr-Ca-Cu-O system superconducting thin film formed on a substrate under an atomic layer control condition in accordance with a method of the present invention.

The vacuum chamber 1 is evacuated to attain a vacuum pressure (oxygen partial pressure) of $2 \times 10$ to $8 \times 10$ Torr, and the substrate (MgO single crystalline plate) 3 is heated at a temperature of 600° to 800° C. As shown in FIG. 2, two BiO atomic layers are deposited on the substrate 3 by allowing a bismuth beam from the cell 4 to impinge on the substrate 3 and simultaneously by feeding an oxygen plasma beam from the ECR device 8 to the substrate 3. Maintaining the oxygen plasma beam, and in sequence, a strontium beam from the cell 5, a copper beam from the cell 7, a calcium beam from the cell 6, and, again, a copper beam from the cell 7 are fed thereby to deposit a SrO atomic layer, a CuO atomic layer, a CaO atomic layer and a CuO atomic layer on the substrate 3. Thus, a half-unit cell of $Bi_2Sr_2CaCu_2O_x$(2-2-1-2) is formed. In this case, the Bi Knudsen cell 4, Sr Knudsen cell 5, Ca Knudsen cell 6 and Cu Knudsen cell 7 are heated at 700° C., 740° C, 550° C. and 1080° C., respectively. The ECR device 8 has a microwave power of 100 W and an acceleration voltage of 0.5 kV, and a substrate bias voltage is 0.5 kV.

Next, the operation of the ECR device 8 and the feeding of oxygen are stopped. A Sr atomic layer and two Bi atomic layers are deposited, without oxidation and in sequence, on the CuO atomic layer by bombarding same with the Sr and Bi beams, as shown in FIG. 2.

Thereafter, the ECR device 8 again is operated to generate an oxygen plasma beam, and, in sequence, a copper beam from the cell 7, a calcium beam from the cell 6, a copper beam from the cell 7, a strontium beam from the cell 5, and again, a bismuth beam from the cell 4 are fed thereby to deposit a CuO atomic layer, a CaO atomic layer and a CuO atomic layer, a SrO atomic layer, and two BiO atomic layers, as shown in FIG. 2. Thus, another half-unit cell of $Bi_2Sr_2CaCu_2O_x$ is formed resulting in the formation of one unit Perovskite structure layer of $Bi_2Sr_2CaCu_2O_x$ (2-2-1-2). Such a successive deposition process is repeated to form a multilayer thin film of $Bi_2Sr_2CaCu_2O_x$.

The thus obtained Bi-Sr-Ca-Cu-O system superconducting thin film is cooled at 77 K by using liquid nitrogen, and a critical current density (Jc, A/cm$^2$) of the film is measured by varying a magnetic field intensity B (T) to obtain results indicated with a solid line in FIG. 3.

As a comparative example, a conventional type Bi-Sr-Ca-Cu-O system superconducting thin film is formed in accordance with the above-mentioned successive deposition process, except that the interruption of the ECR device operation and oxygen feeding is not performed. In this case, elements of all the molecular beams are oxidized with the oxygen plasma to deposit oxide layers only. A critical current density (Jc) of the conventional thin film is measured under the same conditions to obtain the results indicated by a broken line in FIG. 3.

As is clear from. FIG. 3, the Bi-Sr-Ca-Cu-O system superconducting thin film according to the present invention has a superior critical current property that is substantially unaffected by a magnetic field compared with the conventional type Bi-Sr-Ca-Cu-O system superconducting thin film.

According to the present invention, the Bi and Sr layers, formed between the half-unit cells, are deposited without oxidation to form the Bi ($BiO_{1-x}$) atomic layer which takes the place of a conventional BiO atomic layer and has a smaller electron-shielding capability, thereby to elongate the coherent length ($\xi c$). Therefore, although the critical current density of a conventional Bi-Sr-Ca-Cu-O system superconducting thin film is significantly reduced under the conditions of increasing the magnetic field intensity, that of the Bi-Sr-Ca-Cu-O system superconducting thin film of the present invention is not significantly so reduced.

It will be obvious that the present invention is not restricted to the above-mentioned embodiments and that many variations are possible for persons skilled in the art without departing from the scope of the invention. For example, it is possible to use a metal-organic (MO-) MBE process instead of the MBE process.

I claim:

1. A method of forming a Bi-Sr-Ca-Cu-O system superconducting thin film, in which first and second half-unit cells constitute a Perovskite structure layer, by using an MBE process or an MO-MBE process with an atomic layer level control capability, comprising the steps of:

depositing oxide atomic layers of the first Bi-Sr-Ca-Cu-O system half-unit cell on a substrate by sequentially feeding respective metal beams of the metals constituting the Bi-Sr-Ca-Cu-O superconducting thin film and simultaneously oxidizing the metals;

depositing a Sr atomic layer by feeding a Sr beam without oxidation on the half-unit cell;

depositing at least one Bi atomic layer by feeding a Bi beam without oxidation on the Sr atomic layer; and depositing oxide atomic layers of the second Bi-Sr-Ca-Cu-O system half-unit cell on the Bi atomic layer by sequentially feeding the respective metal beams of the metals constituting the Bi-Sr-Ca-Cu-O superconducting thin film and simultaneously oxidizing the metals.

2. A method according to claim 1, wherein a single Sr atomic layer and two Bi atomic layers are formed between respective CuO atomic layers of the first and second half-unit cells.

* * * * *

UNITED STATES PATENT AND TRADEMARK OFFICE
CERTIFICATE OF CORRECTION

PATENT NO. : 5,300,484
DATED : April 5, 1994
INVENTOR(S) : Seigen OTANI

It is certified that error appears in the above-indentified patent and that said Letters Patent is hereby corrected as shown below:

COVER PAGE, Item [56], the titles of the first three publications should be corrected as follows:
    line 3, change "BI" to --Bi--;
    line 7, change "BI" to --Bi--;
    line 9, change "an" to --and--.

Col. 1,   line 13, delete "their";
    line 14, after "wirings" insert --,-- and after "using" insert --their--;
    line 42, change "remarkable" to --remarkably--;
    line 46, after "layers" insert --,--;
    line 47, after "function" insert --,--.

Col. 2,   line 24, delete "will";
    line 65, change "$2 \times 10$" to --$2 \times 10^{-6}$--;
    line 66, change "$8 \times 10$" to --$8 \times 10^{-6}$--.

Signed and Sealed this

Sixth Day of September, 1994

Attest:

BRUCE LEHMAN

Attesting Officer      Commissioner of Patents and Trademarks